(12) United States Patent
Kamijima (10) Patent No.: US 6,812,543 B2
(45) Date of Patent: Nov. 2, 2004

(54) MICRO DEVICE THAT GENERATES A MAGNETOMOTIVE FORCE IN A LONG DIRECTION

(75) Inventor: Akifumi Kamijima, Chuo-ku (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 10/370,708

(22) Filed: Feb. 24, 2003

(65) Prior Publication Data

US 2003/0178695 A1 Sep. 25, 2003

(30) Foreign Application Priority Data

Mar. 20, 2002 (JP) .......................................... 2002-079362

(51) Int. Cl.[7] .......................... H01L 29/82; H01L 31/62; H01F 5/00
(52) U.S. Cl. ...................... 257/531; 257/421; 257/528; 336/185; 336/186; 336/187; 336/200
(58) Field of Search ................................ 257/421, 528, 257/531, 696, 698; 336/73, 77, 84 M, 133, 177, 185–187, 200, 232

(56) References Cited

U.S. PATENT DOCUMENTS

| 4,423,451 A | * | 12/1983 | Chi .............................. 360/125 |
| 6,278,352 B1 | * | 8/2001 | Huang et al. ................ 336/200 |
| 2002/0075116 A1 | * | 6/2002 | Peels et al. .................. 336/200 |

* cited by examiner

Primary Examiner—Minhloan Tran
Assistant Examiner—Thomas L Dickey
(74) Attorney, Agent, or Firm—Oliff & Berridge, PLC (57) ABSTRACT

A micro device includes a first magnetic layer, a second magnetic layer and a thin film coil. The first magnetic layer and the second magnetic layer are formed so as to be opposite to each other and magnetically connected via a joint. The thin film coil includes a planer round portion winding around the joint in between the first and the second magnetic layers and a perpendicular round portion provided perpendicularly to the planer round portion.

12 Claims, 11 Drawing Sheets

MICRO DEVICE THAT GENERATES A MAGNETOMOTIVE FORCE IN A LONG DIRECTION

BACKGROUND OF THE INVENTION

1. Field of the Invention

This invention relates to a micro device which has a thin film coil therein. As the micro device are exemplified a thin film magnetic head, a thin film inductor, a semiconductor device, a thin film actuator, or a composite device equipped with one or some of the thin film devices.

2. Related Art Statement

A thin film magnetic head including a writing element and a reading element is a type of micro device. Normally, the writing head includes a first and a second magnetic layers, a thin film coil, and a first and a second leading conductors. The magnetic layers are formed so as to be opposite to each other, and magnetically joined with a joint (back gap portion).

The thin film coil is formed so as to wind the joint in between the first and the second magnetic layers. The thin film coil includes a first and a second coil terminals. The first coil terminal is provided at the most inner side of the thin film coil and the second coil terminal is provided at the most outer side of the thin film coil.

One end of the first leading conductor is connected to the first coil terminal, and the one end of the second leading conductor is connected to the second coil terminal. The first and the second leading conductors are connected to pull-out electrodes (hereinafter, called as a "bump").

In order to develop the writing performance of the thin film magnetic head, it is required to increase the magnetomotive force, which can be performed by increasing coil current in the thin film coil or increasing the turn number of the thin film coil.

However, the increase of coil current causes the increase of the heat generation, so the writing performance of the thin film magnetic head is restricted because the heat generation must be reduced less than a given threshold value. Also, in view of the recent requirement of miniaturization for a micro device, it is difficult to increase the turn number of the thin film coil.

In addition, the increase of turn number of the thin film coil causes the elongation of the magnetic path by round pitches, resulting in the degradation of the high frequency performance of the thin film magnetic head.

SUMMARY OF THE INVENTION

It is an object of the present invention to provide a micro device of thin film layered structure, particularly a thin film magnetic head and a thin film inductor where a magnetomotive force can be enhanced without the increase of the turn number of the planer coil.

It is another object of the present invention to provide a micro device of thin film layered structure, particularly a thin film magnetic head and a thin film inductor where a magnetomotive force can be enhanced without the increase of the magnetic path and the degradation of the high frequency performance.

For achieving the above objects, this invention relates to a micro device comprising a first magnetic layer, a second magnetic layer and a thin film coil, wherein the first magnetic layer and the second magnetic layer are formed so as to be opposite to each other and magnetically connected via a joint, and the thin film coil includes a planer round portion winding around the joint in between the first and the second magnetic layers and a perpendicular round portion provided perpendicularly to the planer round portion.

According to the micro device of the present invention, since the perpendicular round portion is formed in the thin film coil, in addition to the normal planer round portion, a relatively large magnetomotive force can be generated without the increase of the turn number of the normal planer round portion in the thin film coil, originated from the perpendicular round portion. As a result, the magnetomotive force can be enhanced without the substantial increase of the magnetic path and thus, the reduction of the high frequency performance.

For example, the above-mentioned perpendicular round portion can be formed as follows. A first leading conductor and a second leading conductor are additionally prepared. Then, the thin film coil is formed so as to include a first coil terminal provided at the most inner side thereof and a second coil terminal provided at the most outer side thereof. Then, the second leading conductor is connected to one end of the second coil terminal. One end of the first leading conductor is connected to one end of the first coil terminal passing below the second magnetic layer, and the other end of the first leading conductor is pulled out in an opposite direction to the first coil terminal above the second magnetic layer.

In this case, the perpendicular round portion by about half to one turn is composed of the first leading conductor and the first coil terminal.

A given coil current is supplied to the thin film coil through the first and the second leading conductors.

The first leading conductor may include plural conductive parts. In this case, one end of one of the conductive parts is connected to one end of the first coil terminal passing below the second magnetic layer, and the other end of the one of the conductive parts is pulled out in an opposite direction to the first coil terminal above the second magnetic layer. Then, the conductive parts are electrically connected to one another at their respective ends. Therefore, the turn number of the perpendicular round portion can be increased, so that a larger magnetomotive force can be generated.

In another embodiment, one end of the second leading conductor is connected to one end of the second coil terminal passing below the second magnetic layer, and the other end of the second leading conductor is pulled out in an opposite direction to the second coil terminal above the second magnetic layer. In this case, the perpendicular round portion by about half to one turn is composed of the second leading conductor and the second coil terminal.

The second leading conductor may include plural conductive parts. In this case, one end of one of the conductive parts is connected to one end of the second coil terminal passing below the second magnetic layer, and the other end of the one of the conductive parts is pulled out in an opposite direction to the second coil terminal above the second magnetic layer. Then, the conductive parts are electrically connected to one another at their respective ends. Therefore, the turn number of the perpendicular round portion can be increased, so that a larger magnetomotive force can be generated.

In the present invention, the above-mentioned two types of perpendicular round portions may be combined. That is, one perpendicular round portion is formed of the first leading conductor and the first coil terminal, and another perpendicular round portion is formed of the second leading conductor and the second coil terminal.

As the micro device are exemplified a thin film magnetic head, a thin film inductor, a semiconductor device, a thin film actuator or a composite device with one or some of the devices. Particularly, the micro device can be preferably for the thin film magnetic head or the thin film inductor.

The thin film magnetic head includes a micro device as mentioned above and a slider. The micro device is supported by the slider.

This invention also relates to a thin film magnetic head device which is characterized by comprising a thin film magnetic head as mentioned above and a head supporting device to support the thin film magnetic head.

Moreover, this invention relates to a magnetic recording/reproducing device which is characterized by comprising a thin film magnetic head device as mentioned above and a magnetic recording medium for writing and reading commensurate with the thin film magnetic head.

Other objects, configurations and advantages will be described in detail hereinafter, with reference to the accompanying drawing. It is to be understood that the invention is not intended to be limited to the following specific embodiments.

BRIEF DESCRIPTION OF THE DRAWINGS

For a better understanding of this invention, reference is made to the attached drawings, wherein.

DETAILED DESCRIPTION OF PREFERRED EMBODIMENTS

1. Thin Film Inductor

Figure 1:
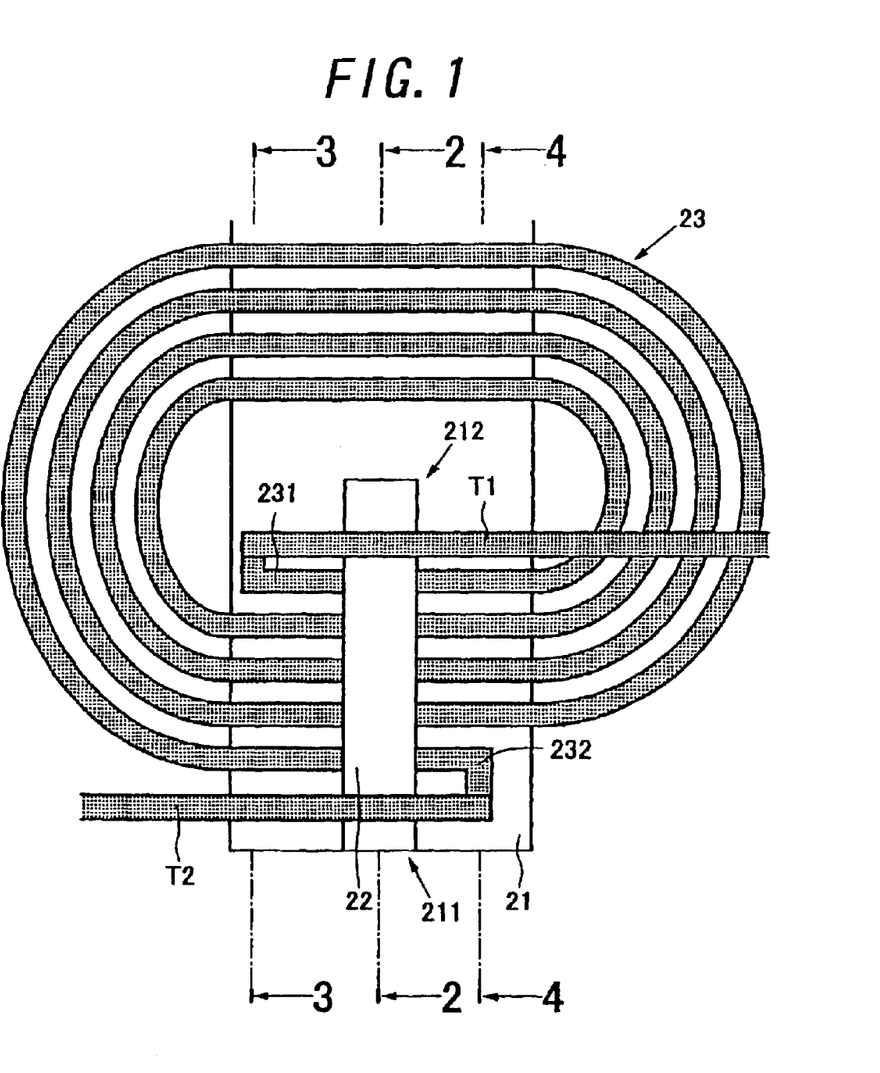
FIG. 1 is a plan view showing a micro device according to the present invention.
Figure 2:
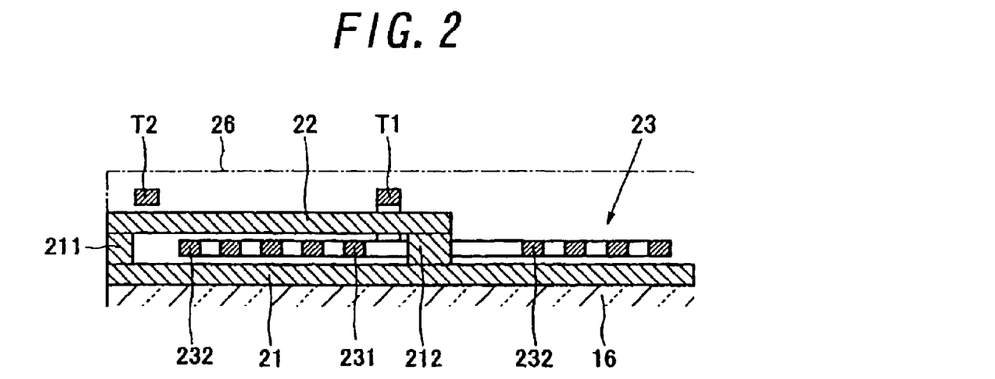
FIG. 2 is a cross sectional view of the micro device shown in FIG. 1, taken on line "2—2"
Figure 3:
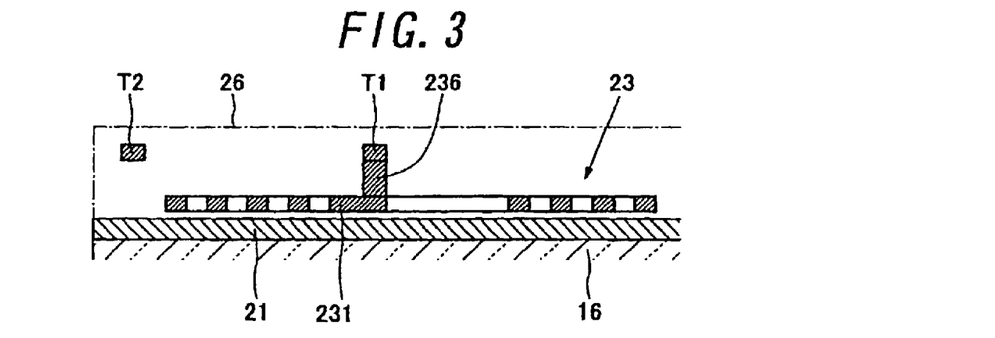
FIG. 3 is a cross sectional view of the micro device shown in FIG. 1, taken on line "3—3"
Figure 4:
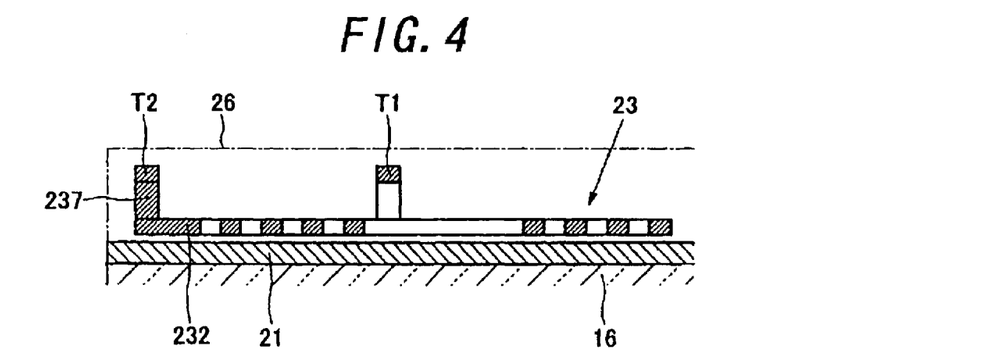
FIG. 4 is a cross sectional view of the micro device shown in FIG. 1, taken on line "4—4"

First of all, a thin film inductor will be described as a micro device, hereinafter. FIG. 1 is a plan view showing a micro device according to the present invention, and FIG. 2 is a cross sectional view of the micro device shown in FIG. 1, taken on line "2—2". FIG. 3 is a cross sectional view of the micro device shown in FIG. 1, taken on line "3—3", and FIG. 4 is a cross sectional view of the micro device shown in FIG. 1, taken on line "4—4".

The thin film conductor illustrated in FIGS. 1–4 includes a first magnetic layer 21, a second magnetic layer 22, a thin film coil 23, a first leading conductor T1 and a second leading conductor T2. These components are covered with an insulating film 26 made of inorganic material. For clarifying the inner structure of the thin film inductor, the insulating film 26 is designated by a dashed line.

The first magnetic layer 21 is formed within a relatively large area, and one main surface of the magnetic layer 21 is flattened. The second magnetic layer 22 is formed so as to be opposite to one main surface of the first magnetic layer 21, and both ends of the magnetic layer 22 are magnetically connected to the first magnetic layer 21 at joints 211 and 212.

The first and the second magnetic layers 21 and 22 may be made of a magnetic material such as NiFe, CoFe, FeN or FeZrN. The first and the second magnetic layers 21 and 22 is composed of a single layered structure or a multilayered structure. Each thickness of the layers 21 and 22 is set within 0.5–3 $\mu$m. The first and second magnetic layers 21 and 22 may be formed by means of frame-plating method.

The thin film coil 23 is wound in plane around the joint 212 between the first and the second magnetic layers 21 and 22. The thin film coil 23 is made of a conductive metallic material such as Cu. The planer winding configuration may be set to a normal whirling shape, an elliptical whirling shape, a rectangular whirling shape or the like.

The thin film coil 23 includes a first coil terminal 231 and a second coil terminal 232. The first coil terminal 231 is provided at the most inner side and the second coil terminal 232 is provided at the most outer side.

The first leading conductor T1 is connected to one end of the first coil terminal 231, and the second leading conductor T2 is connected to one end of the second coil terminal 232.

Concretely, one end of the first leading conductor T1 is connected to the one end of the first coil terminal 231 passing below the second magnetic layer 22, and the other end is pulled out in the opposite direction to the first coil terminal 231 with passing above the second magnetic layer 22. The gap between the one ends of the first coil terminal 231 and the first leading conductor T1 is complemented with a conductive connector 236 (see, FIG. 3).

In this embodiment, one end of the second leading conductor T2 is also connected to the one end of the second coil terminal 232 in the same manner as mentioned above via a conductive connector 237. Concretely, one end of the second leading conductor T2 is connected to the one end of the second coil terminal 232 passing below the second magnetic layer 22, and the other end is pulled out in the opposite direction to the second coil terminal 232 with passing above the second magnetic layer 22. The gap between the one ends of the second coil terminal 232 and the second leading conductor T2 is complemented with a conductive connector 237 (see, FIG. 4).

As mentioned above, in the thin film conductor illustrated in FIGS. 1–4, the second magnetic layer 22 is provided so as to be opposite to the first magnetic layer 21, and is magnetically connected therewith at the joints 211 and 212. Also, the thin film coil 212 is provided in between the first and second magnetic layers 21 and 22 so as to wind in plane around the joint 212. Therefore, a magnetomotive force is generated on the turn number and the coil current.

As mentioned above, the thin film coil 23 includes a first coil terminal 231 and the second coil terminal 232. The first coil terminal 231 is provided at the most inner side of the coil 23, and the second coil terminal 232 is provided at the most outer side of the coil 23. The leading conductor T1 is connected to the one end of the first coil terminal 231, and the leading conductor T2 is connected to the one end of the second coil terminal 232. Therefore, the coil current can be supplied to the coil 23 via the leading conductors T1 and T2.

In the thin film inductor, the fundamental configuration is the same as the conventional one, but the configuration can be characterized as follows. One end of the first leading conductor T1 is connected via the conductive connector 236 to the one end of the first coil terminal 231 passing below the second magnetic layer 22, and the other end is pulled out in the opposite direction to the first coil terminal 231 with passing above the second magnetic layer 22.

In this case, a perpendicular round portion can be made of the first coil terminal 231, the conductive connector 236 and the first leading conductor T1. Therefore, in addition to the normal planer round portion, the perpendicular round portion can be created in the thin film coil 23. In the thin film inductor illustrated in FIGS. 1–4, the turn number of the perpendicular round portion is set to about (¾) turn. As a result, a relatively large magnetomotive force can be generated in the thin film coil 23 without the increase of the turn number of the normal planer round portion, originated from the perpendicular round portion.

As mentioned above, since the magnetomotive force is increased originated from the perpendicular round portion of the thin film coil 23, the magnetic path is not elongated substantially, not resulting in the degradation of the high frequency performance.

In this embodiment, another perpendicular round portion is formed of the second coil terminal 232, the conductive connector 237 and the second leading conductor T2 in the thin film coil 23. Therefore, the magnetomotive force is also increased originated from the additional perpendicular round portion. The turn number of the additional perpendicular round portion is set to about (¾) turn.

Accordingly, in this embodiment, the total perpendicular round portions by about 1.5 turn is added to the normal planer round portion in the thin film coil 23, which causes the increase of the magnetomotive force in the thin film coil 23 without the increase of the turn number of the planer round portion.

In this embodiment, as mentioned above, two types of perpendicular round portions are provided in the thin film coil, but either type will do. That is, either the perpendicular round portion made of the first coil terminal 231, the conductive connector 236 and the first leading conductor T1 or the perpendicular round portion made of the second coil terminal 232, the conductive connector 236 and the second leading conductor T2 will do.

Figure 5:
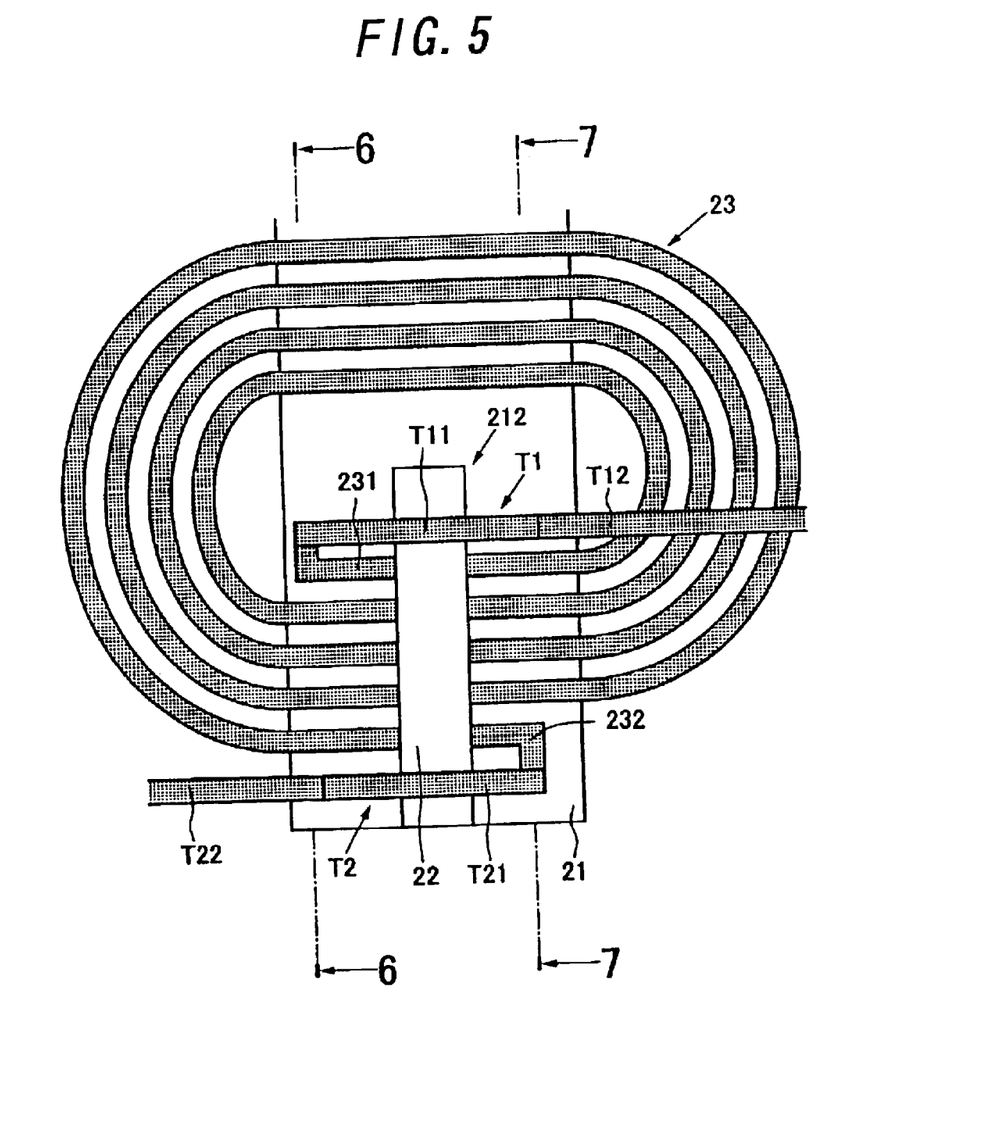
FIG. 5 is a plan view showing another micro device according to the present invention.
Figure 6:
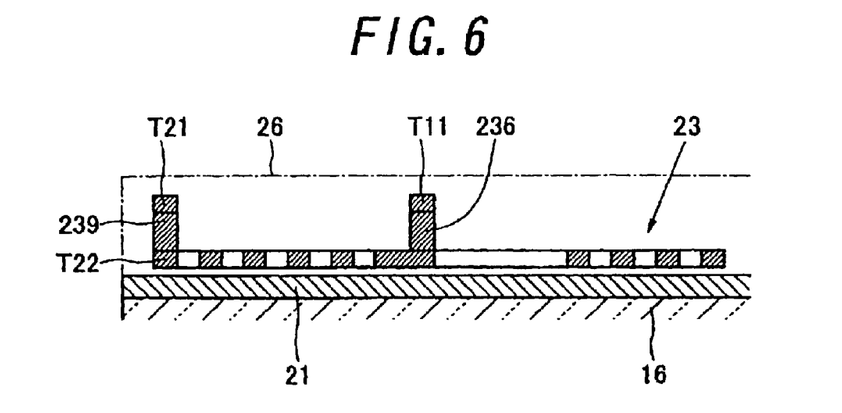
FIG. 6 is a cross sectional view of the micro device shown in FIG. 5, taken on line "6—6"
Figure 7:
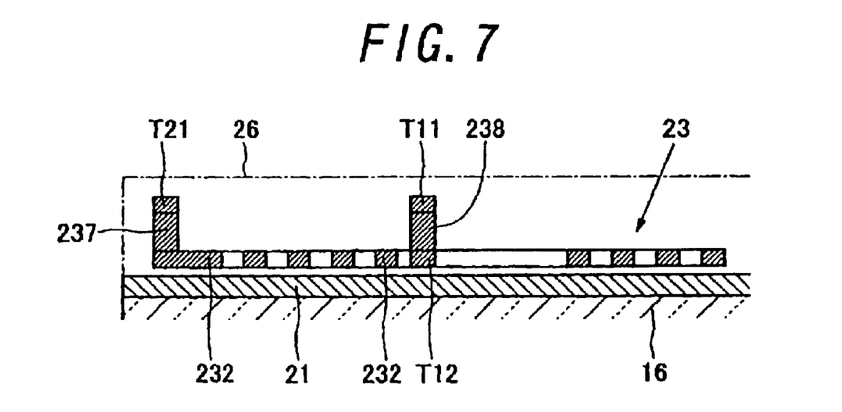
FIG. 7 is a cross sectional view of the micro device shown in FIG. 5, taken on line "7—7.

FIG. 5 is a plan view showing another micro device according to the present invention. FIG. 6 is a cross sectional view of the micro device shown in FIG. 5, taken on line "6—6", and FIG. 7 is a cross sectional view of the micro device shown in FIG. 5, taken on line "7—7. In this case, another thin film inductor will be described as a micro device, hereinafter. Like reference numbers designate like or corresponding parts throughout FIGS. 1–7. Therefore, explanation will be omitted for like or corresponding parts.

In this embodiment, the first leading conductor T1 is composed of conductive parts T11 and T12. Then, one end of the conductive part T11 is connected to one end of the first coil terminal 231 via the conductive connector 236. The other end of the conductive part T11 is pulled out in the opposite direction to the joint above the second magnetic layer 22. The conductive part T12 is located below the conductive part T11, and the gap between the conductive parts T11 and T12 is complemented with a conductive connector 238. Therefore, the conductive parts T11 and T12 are electrically connected, to form the first leading conductor T1.

In this case, a perpendicular round portion by about one turn is formed of the first coil terminal 231 and the first leading conductor T1 in the thin film coil 23, in addition to the normal planer round portion. Therefore, a relatively large magnetomotive force can be generated in the thin film coil 23 without the increase of the turn number of the planer round portion, originated from the perpendicular round portion.

In this embodiment, the second leading conductor T2 is also composed of conductive portions T21 and T22. One end of the conductive part T21 is connected to one end of the second coil terminal 232 via the conductive connector 236, and the other end of the conductive part T21 is pulled out in the opposite direction to the joint above the second magnetic layer 22.

The conductive part T22 is located below the conductive part T21, and the gap between the conductive parts T21 and T22 is complemented with a conductive connector 238.

In this case, another perpendicular round portion by about one turn is formed of the second coil terminal 232 and the second leading conductor T2 in the thin film coil 23. Therefore, the total perpendicular round portion by about two turn is formed in the thin film coil 23, which causes the increase of the magnetomotive force in the thin film coil 23 without the increase of the turn number of the normal planer round portion.

2. Thin Film Magnetic Head

Figure 8:
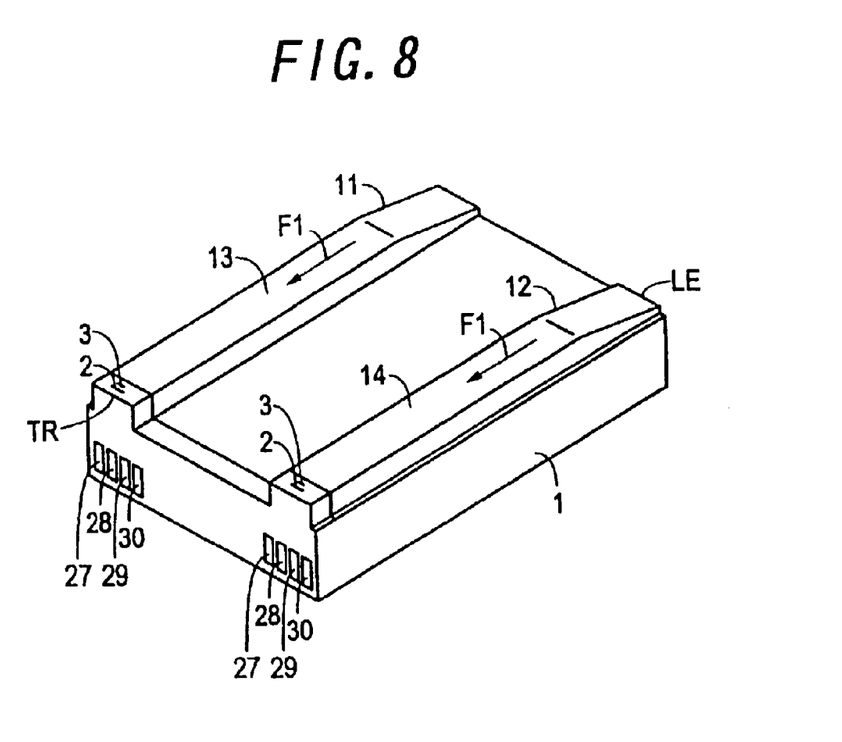
FIG. 8 is a perspective view showing a thin film magnetic head according to the present invention.
Figure 9:
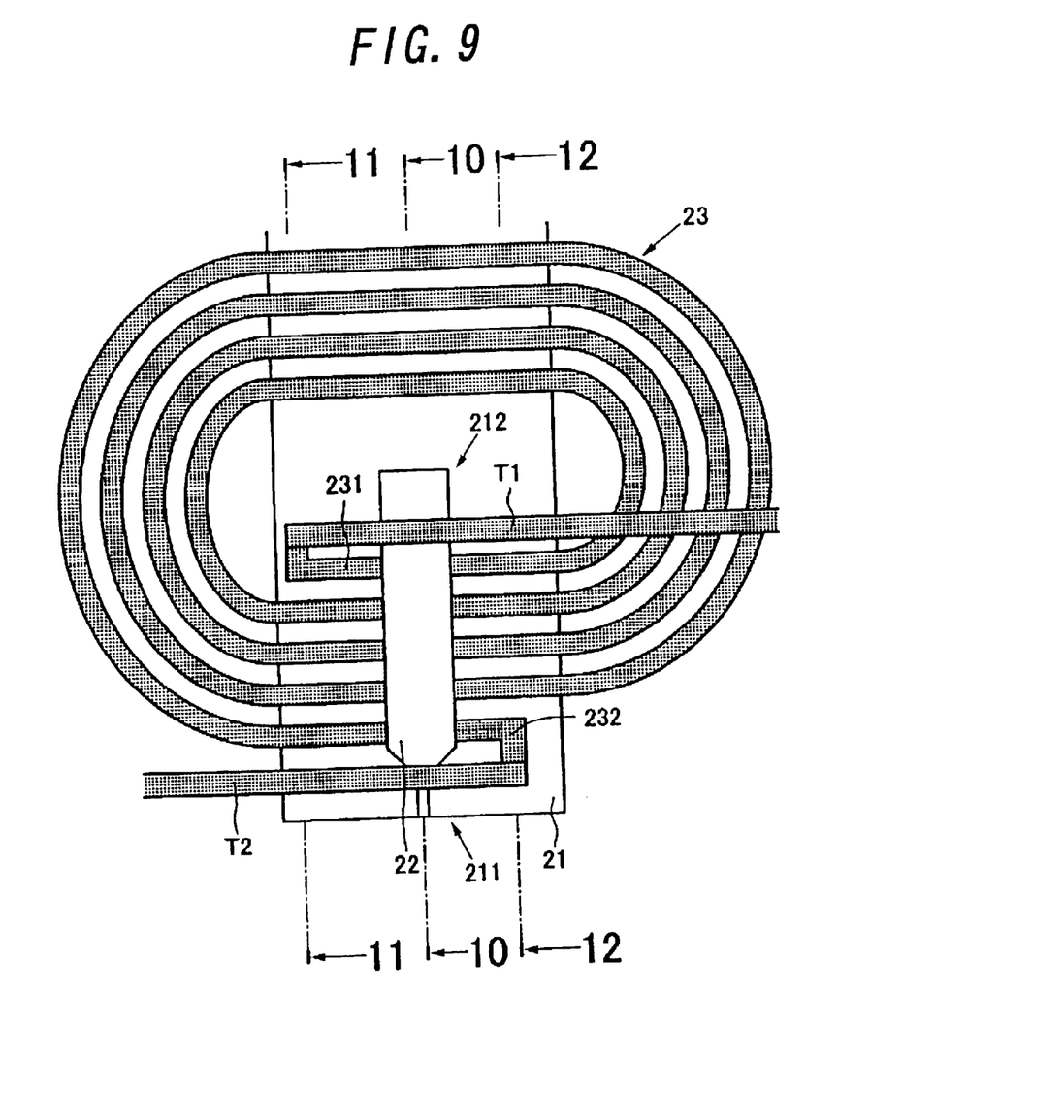
FIG. 9 is a plan view showing the thin film coil of the thin film magnetic head shown in FIG. 8.
Figure 10:
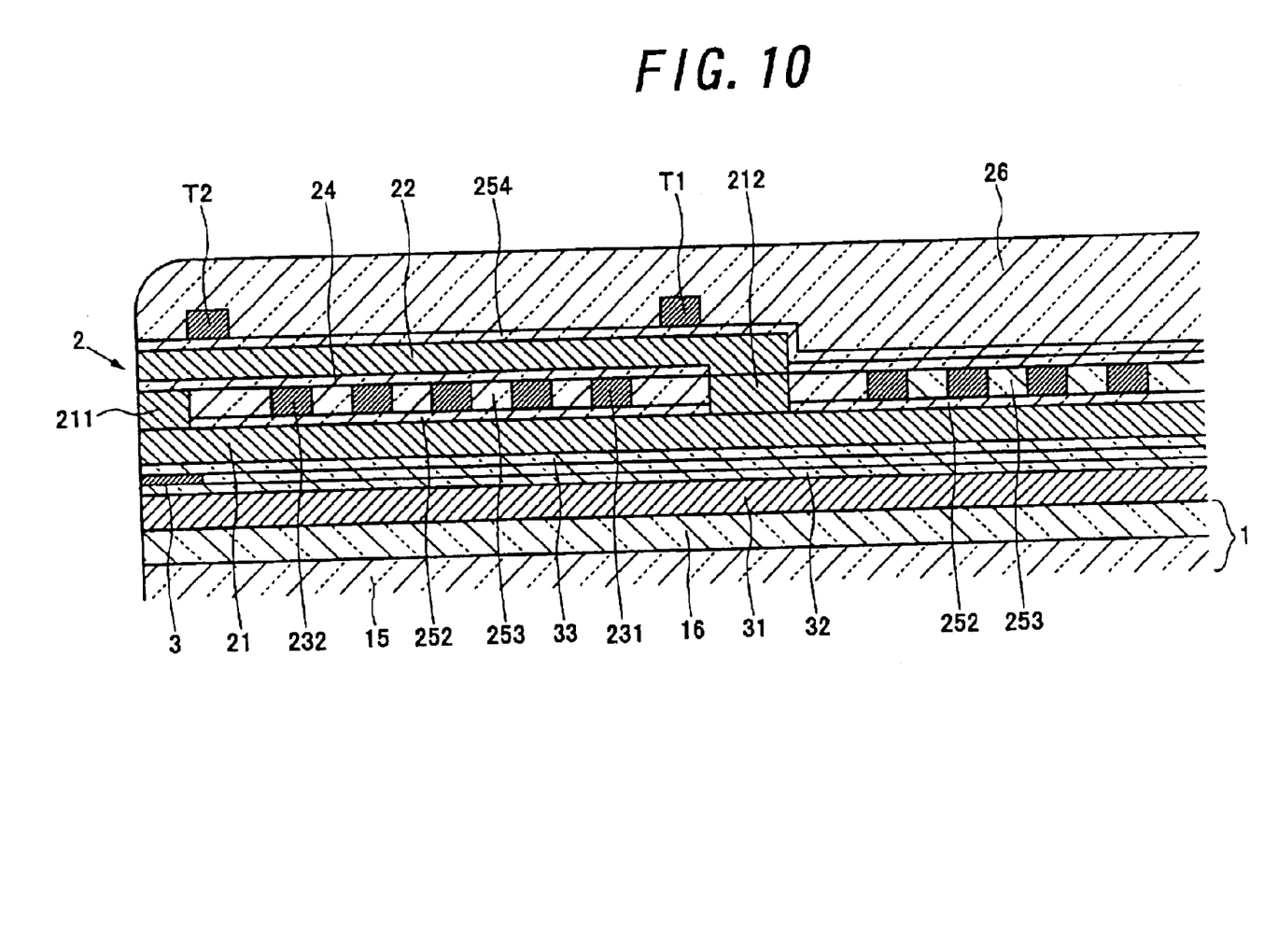
FIG. 10 is a cross sectional view in enlargement showing a portion of the thin film magnetic head shown in FIG. 9, taken on line "10—10"
Figure 11:
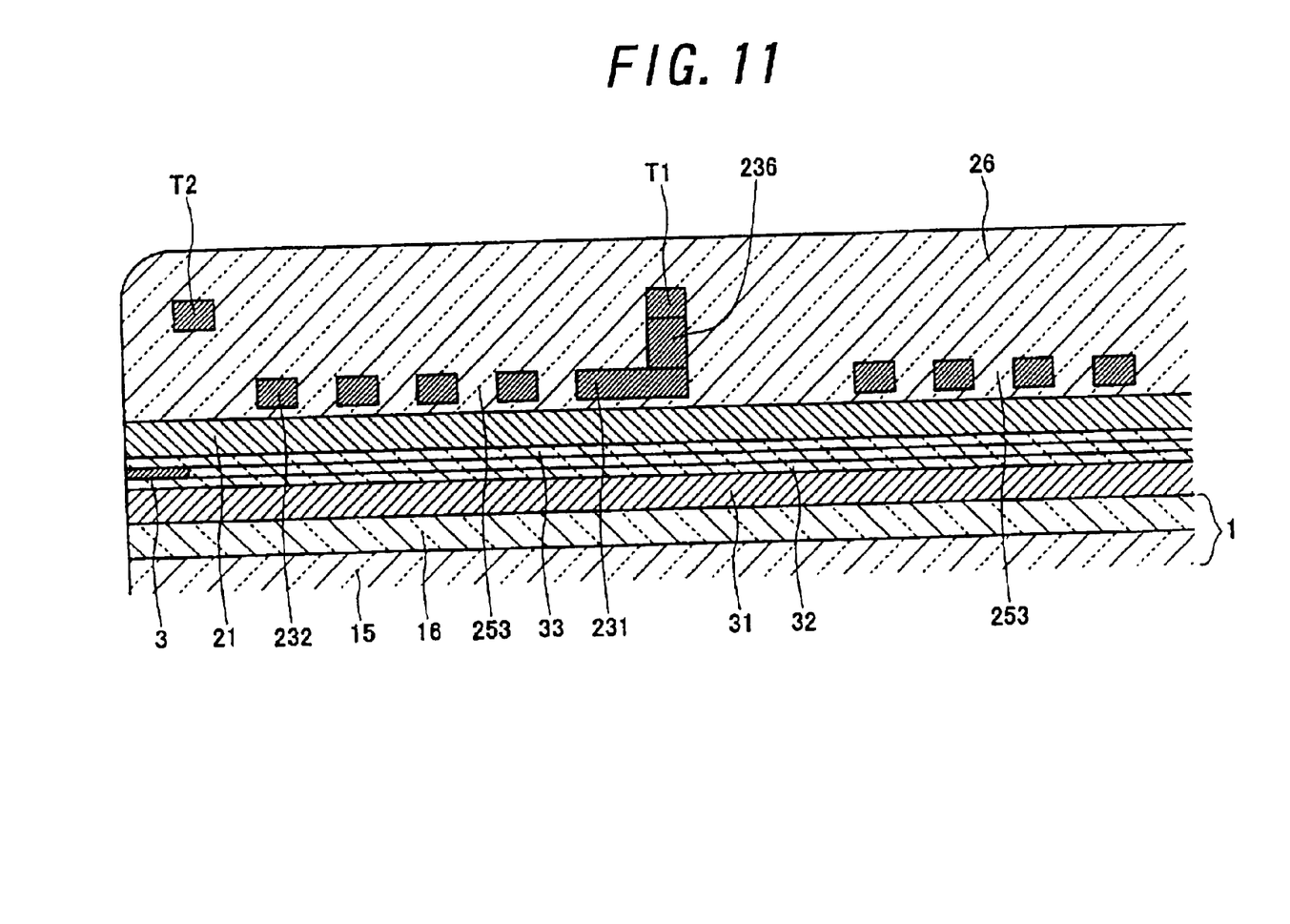
FIG. 11 is a cross sectional view in enlargement showing a portion of the thin film magnetic head shown in FIG. 9, taken on line "11—11"
Figure 12:
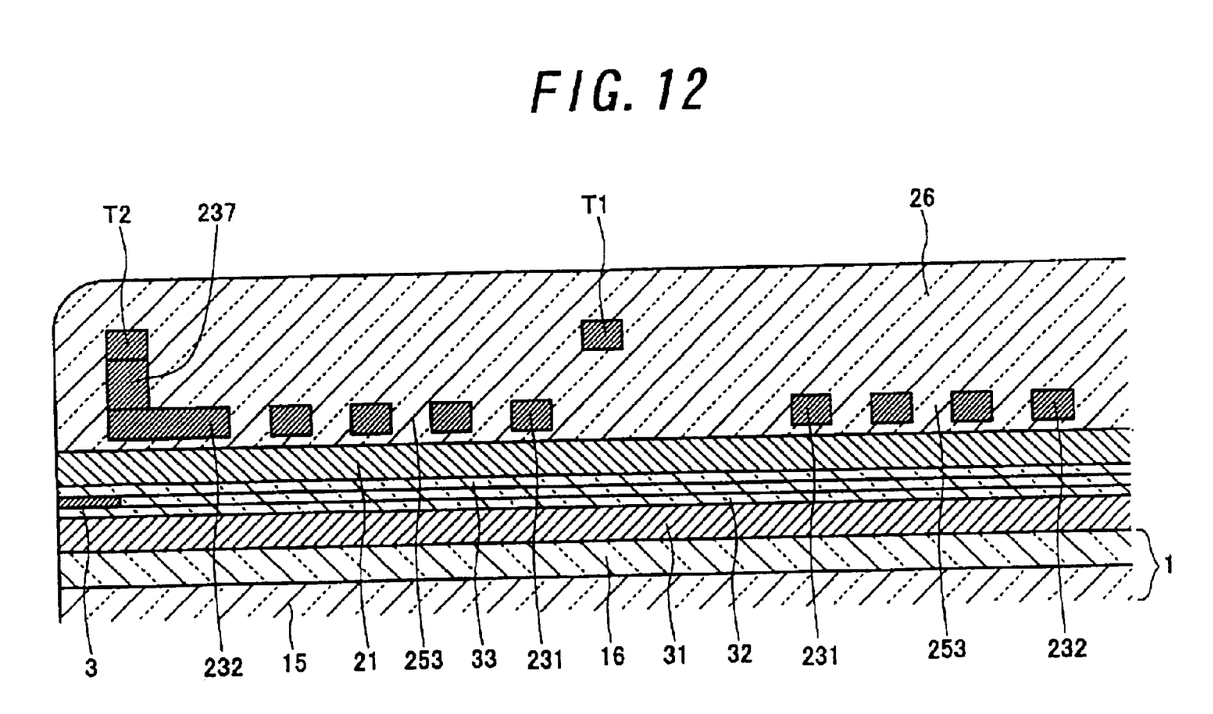
FIG. 12 is a cross sectional view in enlargement showing a portion of the thin film magnetic head shown in FIG. 9, taken on line "12—12"

Next, a thin film magnetic head will be described as a micro device, hereinafter. FIG. 8 is a perspective view showing a thin film magnetic head according to the present invention, and FIG. 9 is a plan view showing the thin film coil of the thin film magnetic head shown in FIG. 8. FIG. 10 is a cross sectional view in enlargement showing a portion of the thin film magnetic head shown in FIG. 9, taken on line "10—10", and FIG. 11 is a cross sectional view in enlargement showing a portion of the thin film magnetic head shown in FIG. 9, taken on line "11—11". FIG. 12 is a cross sectional view in enlargement showing a portion of the thin film magnetic head shown in FIG. 9, taken on line "12—12".

The thin film magnetic head illustrated in FIGS. 8–12 includes a slider 1, a writing element 2 and a reading element 3 which are supported by the slider 1.

The slider 1 has rail portions 11 and 12 on its medium opposing surface, and the surfaces of the rail portions 11 and 12 are employed as ABSs 13 and 14. The slider 1 is not always required to have the two rail portions 11 and 12. For example, it may have one to three rail parts or a flat surface without the rail. For improving its floating performance, the slider 1 may have rail portions with geometrical shapes. This invention can be applied for any kind of slider.

The slider 1 may have a protection film with a thickness of 3–8 nm made of DLC or the like on the rail portions, and in this case, the ABSs 13 and 14 are composed of the surfaces of the protection film. The slider 1 is a ceramic structural body which is composed of a base 15 made of $Al_2O_3$—TiC or the like and an insulating layer 16 made of $Al_2O_3$, $SiO_2$ or the like on the base 15.

The writing element 2 and the reading element 3 are provided on both of the ABSs 13 and 14 of the rail portions 11 and 12 in an air outflow edge TR. Generally, the writing element 2 is composed of an inductive type magnetic conversion element, and the reading element 3 is composed of a MR element.

The reading element 3 is embedded in an inorganic insulating film 33 in between a first shielding film 31 and the first magnetic layer 21. The reading element 3 may be made of a spin-valve film or a giant magneto-resistive effective element (GMR element) with ferromagnetic tunnel junction.

As is apparent from FIGS. 10–12, the thin film magnetic head includes the first magnetic layer 21, the second magnetic layer 22, the thin film coil 23, the first shielding film 31, inorganic insulating films 32 and 33, inorganic insulating films 252 and 254, a coil insulating layer 253, a gap layer 24, the first and the second leading conductors T1 and T2, the reading element 3 and the protection film 26. The first magnetic layer 21 may double as a second shielding film.

The first shielding film 31, the first and the second magnetic layers 21 and 22 may be made of permalloy or the like. The insulating films 32, 33, 252 and 254 may be made of an inorganic insulating material such as $Al_2O_3$. The thin film coil 23, the first and the second leading conductor T1 and T2 may be made of a conductive metallic material such as Cu. The gap layer 24 and the protection film 26 may be made of an inorganic insulating material such as $Al_2O_3$, $SiO_2$ or the like.

The forefronts of the first and the second magnetic films 21 and 22 are opposed each other via the gap layer 24 with a minute thickness, and thereby, constitute an upper pole portion P1 and a lower pole portion P2 for writing, respectively.

The second magnetic layer 22 is formed so as to be opposite to the first magnetic layer 21, and one end of the second magnetic layer 22 is magnetically connected to the first magnetic layer 21 via the joint 212. Concretely, the first and the second magnetic layers 21 and 22 are magnetically connected each other via the joint 212 located backward from the ABSs 13 and 14, to complete a thin film magnetic circuit.

The first and the second magnetic layers 21 and 22 may be made of a magnetic material such as NiFe, CoFe, FeN, FeZrN or the like. The magnetic layers may be composed of a single layered structure or a multilayered structure, respectively. Each thickness of the magnetic layers may be set within 0.5–3 μm. The magnetic layers 21 and 22 may be formed by means of frame-plating method.

The thin film coil 23 winds in plane around the joint 212 in between the first and the second magnetic layers 21 and 22. As mentioned above, the thin film coil 23 is made of a conductive metallic material such as Cu.

The thin film coil 23 includes the first coil terminal 231 and the second coil terminal 232. The first coil terminal 231 is provided at the most inner side and the second coil terminal 232 is provided at the most outer side.

The first leading conductor T1 is connected to the first coil terminal 231 via the conductive connector 236. Concretely, one end of the first leading conductor T1 is connected via the conductor T1 to one end of the first coil terminal 231 passing below the second magnetic layer 22, and the other end is pulled out in the opposite direction to the joint thereof.

In this case, a perpendicular round portion by about (¾) turn is formed of the first coil terminal 231, the conductive connector 236 and the first leading conductor T1 in the thin film coil 23, in addition to the normal planer round portion. Therefore, a relatively large magnetomotive force can be generated in the thin film coil 23, originated from the perpendicular round portion.

In this case, since the magnetomotive force can be enhanced without the increase of the turn number of the normal planer round portion in the thin film coil 23, the magnetic path is not elongated substantially, not resulting in the degradation of the high frequency performance.

In this embodiment, the second leading conductor T2 is connected to the second coil terminal 232 via the conductive connector 237. Therefore, another perpendicular round portion by about (¾) turn is formed of the second coil terminal 232, the conductive connector 237 and the second leading conductor T2.

As a result, in this embodiment, the above-mentioned two types of perpendicular round portion combined, it is turned out that the total perpendicular round portion by about 1.5 turn is formed in the thin film coil 23, so that the magnetomotive force can be enhanced without the increase of the turn number of the normal planer round portion in the coil 23. As mentioned above, the two types of perpendicular round portion are not always required, but either type will do.

Although illustration and detail explanation are omitted, a thin film coil configuration as shown in FIGS. 5–7 may be employed for the above thin film magnetic head.

Figure 13:
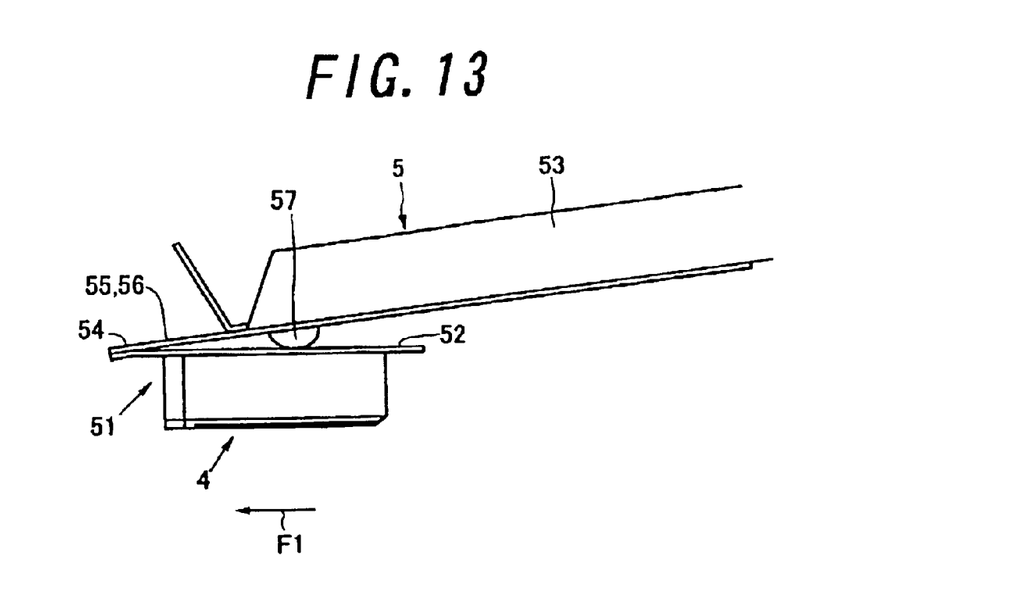
FIG. 13 is an elevational view showing a thin film magnetic head device.

3. Thin Film Magnetic Head Device and Magnetic Recording/Reproducing Device Utilizing a Thin Film Magnetic Head Next, a thin film magnetic head device and a magnetic recording/reproducing device which utilize a thin film magnetic head will be described. FIG. 13 is an elevational view showing a thin film magnetic head device, and FIG. 14 is a bottom plan view of the thin film magnetic head device shown in FIG. 13.

Figure 14:
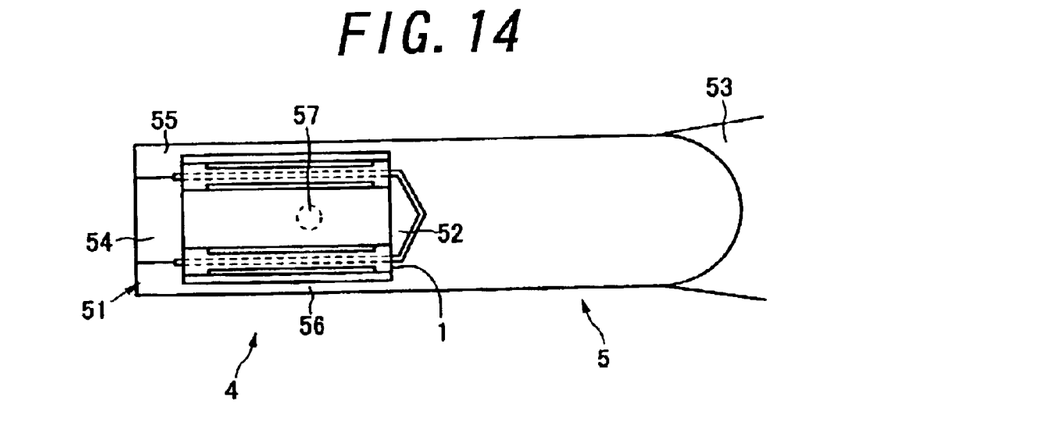
FIG. 14 is a bottom plan view of the thin film magnetic head device shown in FIG. 13.

The magnetic head device illustrated in FIGS. 13 and 14 includes a head supporting device 5 and a thin film magnetic head 4 as shown in FIGS. 9–12.

The head supporting device 5 is composed of a supporter 53 made of a metallic plate and a flexibler 51 made of a metallic plate provided on the free edge of the supporter 53 in its longitudinal direction. The thin film magnetic head 4 is attached on the lower surface of the flexibler 51.

The flexibler 51 has two outerframes 55 and 56 substantially parallel to the supporter 53 in its longitudinal direction, a lateral frame 54 to join the outerframes 55 and 56 in the remote portion thereof from the supporter 53, and a tongue shaped member 52, of which the forefront is free, extending substantially parallel to the outerframes 55 and 56 from the almost central portion of the lateral frame 54.

On the almost central portion of the tongue shaped member 52 is provided a hemispheric loading convex portion 57 bulging on the supporter 53. The loading convex portion 57 conducts a load to the tongue shaped member 52 from the free edge of the supporter 53. The thin film magnetic head 4 is attached to the lower surface of the tongue shaped member 52 by an adhesive agent so that the air outflow side can correspond to the longitudinal direction of the lateral frame 54. In this invention, any kind of head supporting apparatus may be employed, besides the above head supporting apparatus 5.

Figure 15:
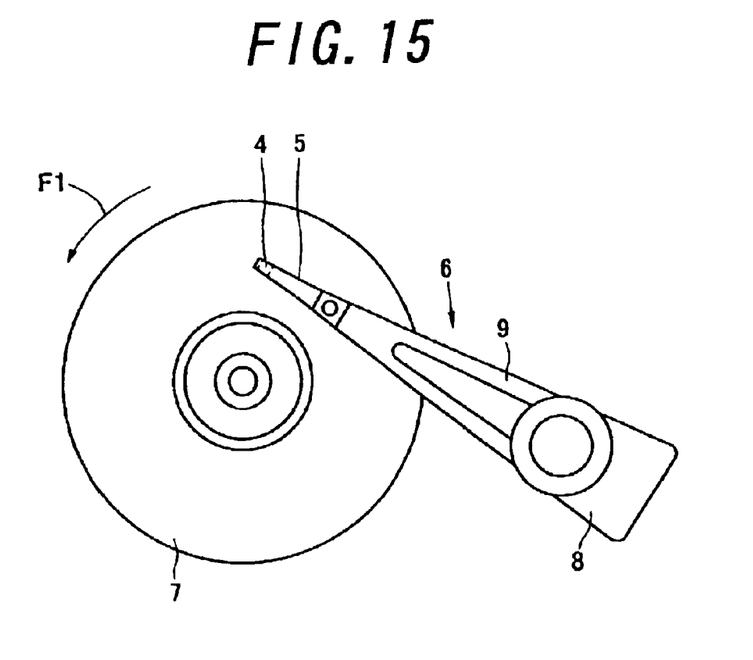
FIG. 15 is a plan view showing a magnetic recording/reproducing device according to the present invention.

FIG. 15 is a plan view showing a magnetic recording/reproducing device according to the present invention. The magnetic recording/reproducing device illustrated in FIG. 15 includes a magnetic recording medium 7 and a thin film magnetic head device 6 as shown in FIGS. 13 and 14 for writing and reading.

In the thin film magnetic head device 6, one end of a head supporting device 5 is attached on one end of an arm 9, and the other end of the arm 9 is supported by a position-determining device 8 including voice coil, etc., and driven. The thin film magnetic head 4 is mounted on the free edge of the head supporting device 5 so as to oppose the magnetic recording surface of the magnetic recording medium 7.

When the magnetic recording medium 7 is rotated in the F1 arrow direction by not shown driving device, the thin film magnetic head 4 floats from on the magnetic recording medium 7 by a minute space. In FIG. 15, the thin film magnetic head 4, attached on the forefront of the head supporting device 5, is moved in the radial direction, and then, the thin film magnetic head 4 is positioned at a given track of the magnetic recording medium 7 by the position determining device 8 which rotates the head supporting device 5.

Although the present invention was described in detail with reference to the above examples, this invention is not limited to the above disclosure and every kind of variation and modification may be made without departing from the scope of the present invention.

As mentioned above, according to the present invention, a micro device of thin film layered structure, particularly a thin film magnetic head and a thin film inductor, where a magnetomotive force can be enhanced without the increase of the turn number of the planer coil, can be provided.

What is claimed is:

1. A micro device comprising a first magnetic layer, a second magnetic layer, a thin film coil and a first leading conductor and a second leading conductor, said first magnetic layer and said second magnetic layer being formed so as to be opposite to each other and magnetically connected via a joint, said thin film coil including a planer round portion winding around said joint in between said first and said second magnetic layers to generate a magnetomotive force in a long direction of said second magnetic layer, a perpendicular round portion provided perpendicularly to said planer round portion and along a side of said second magnetic layer to generate an additional magnetomotive force in said long direction of said magnetic layer, said thin film coil including a first coil terminal provided at the most inner side thereof and a second coil terminal provided at the most outer side thereof, said second leading conductor being connected to one end of said second coil terminal, one end of said first leading conductor being connected to one end of said first coil terminal that passes below said second magnetic layer, and the other end of said first leading conductor being pulled out in an opposite direction to said first coil terminal above said second magnetic layer, whereby said perpendicular round portion is made of said first leading conductor and said first coil terminal.

2. The micro device as defined in claim 1, wherein said first leading conductor includes plural conductive parts, one end of one of said conductive parts being connected to one end of said first coil terminal passing below said second magnetic layer, the other end of said one of said conductive parts being pulled out in an opposite direction to said first coil terminal above said second magnetic layer, said conductive parts being electrically connected to one another at their respective ends.

3. The micro device as defined in claim 1, one end of said second leading conductor being connected to one end of said second coil terminal that passes below said second magnetic layer, the other end of said second leading conductor being pulled out in an opposite direction to said second coil terminal above said second magnetic layer, whereby said perpendicular round portion is made of said second leading conductor and said second coil terminal.

4. The micro device as defined in claim 3, wherein said second leading conductor includes plural conductive parts, one end of one of said conductive parts being connected to one end of said second coil terminal passing below said second magnetic layer, the other end of said one of said conductive parts being pulled out in an opposite direction to said second coil terminal above said second magnetic layer, said conductive parts being electrically connected to one another at their respective ends.

5. The micro device as defined in claim 4, wherein said first leading conductor includes plural additional conductive parts, one end of one of said additional conductive parts being connected to one end of said first coil terminal passing below said second magnetic layer, the other end of said one of said additional conductive parts being pulled out in an opposite direction to said first coil terminal above said second magnetic layer, said additional conductive parts being electrically connected to one another at their respective ends.

6. A thin film inductor comprising a micro device as defined in claim 1.

7. A thin film magnetic head comprising a micro device as defined in claim 1.

8. The thin film magnetic head as defined in claim 7, further comprising a reading element with a giant magnetoresistive effective element.

9. The thin film magnetic head as defined in claim 8, said giant magnetoresistive effective element includes a spin-valve film or a ferromagnetic tunnel junction.

10. The thin film magnetic head as defined in claim 7, further comprising a slider, wherein said micro device is supported by said slider.

11. A thin film magnetic head device comprising a thin film magnetic head as defined in claim 7 and a head supporting device to support said thin film magnetic head.

12. A magnetic recording/reproducing device comprising a thin film magnetic head device as defined in claim 11 and a magnetic recording medium to be magnetically recorded and reproduced commensurate with said thin film magnetic head.

* * * * *